(12) United States Patent
Kurczveil et al.

(10) Patent No.: US 11,581,704 B2
(45) Date of Patent: Feb. 14, 2023

(54) QUANTUM-DOT-BASED NARROW OPTICAL LINEWIDTH SINGLE WAVELENGTH AND COMB LASERS ON SILICON

(71) Applicant: HEWLETT PACKARD ENTERPRISE DEVELOPMENT LP, Houston, TX (US)

(72) Inventors: Geza Kurczveil, Santa Barbara, CA (US); Di Liang, Santa Barbara, CA (US); Jared Hulme, Palo Alto, CA (US); Antoine Deseos, Palo Alto, CA (US); Raymond G. Beausoleil, Palo Alto, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 395 days.

(21) Appl. No.: 16/406,817

(22) Filed: May 8, 2019

(65) Prior Publication Data
US 2020/0358248 A1 Nov. 12, 2020

(51) Int. Cl.
*H01S 5/14* (2006.01)
*H01S 5/12* (2021.01)
(Continued)

(52) U.S. Cl.
CPC ............ *H01S 5/146* (2013.01); *H01S 3/0826* (2013.01); *H01S 3/08031* (2013.01);
(Continued)

(58) Field of Classification Search
CPC .. H01S 5/06246; H01S 5/06821; H01S 5/026; H01S 5/021; H01S 5/14–142; H01S 5/1032
See application file for complete search history.

(56) References Cited

U.S. PATENT DOCUMENTS

| 7,230,963 B2* | 6/2007 | Menon | H01S 5/026 |
| | | | 356/478 |
| 11,005,233 B2* | 5/2021 | Morton | H01S 5/0612 |
| (Continued) | | | |

OTHER PUBLICATIONS

Shuyu Yang et al. "Quantum dot semiconductor optical amplifier/silicon external cavity laser for O-band high-speed optical communications" Optical Engineering 54(2), pp. 026102-0 through 026102-5 (Feb. 2015) (Year: 2015).*
(Continued)

*Primary Examiner* — Xinning(Tom) Niu
*Assistant Examiner* — Delma R Fordé
(74) *Attorney, Agent, or Firm* — Sheppard Mullin Richter & Hampton LLP

(57) ABSTRACT

Narrow-optical linewidth laser generation devices and methods for generating a narrow-optical linewidth laser beam are provided. One narrow-optical linewidth laser generation devie includes a single-wavelength mirror or multiwavelength mirror (for comb lasers) formed from one or more optical ring resonators coupled with an optical splitter. The optical splitter may in turn be coupled with a quantum dot optical amplifier (QDOA), itself coupled with a phase-tuner. The phase tuner may be further coupled with a broadband mirror. The narrow-optical linewidth laser beam is generated by using a long laser cavity and additionally by using an integrated optical feedback.

17 Claims, 9 Drawing Sheets

(51) Int. Cl.
*H01S 5/125* (2006.01)
*H01S 5/02* (2006.01)
*H01S 5/343* (2006.01)
*H01S 5/34* (2006.01)
*H01S 5/062* (2006.01)
*H01S 5/10* (2021.01)
*H01S 3/08031* (2023.01)
*H01S 3/082* (2006.01)
*H01S 5/068* (2006.01)
*H01S 5/026* (2006.01)
*H01S 3/08* (2023.01)
*H01S 3/106* (2006.01)

(52) U.S. Cl.
CPC ............ *H01S 5/021* (2013.01); *H01S 5/0218* (2013.01); *H01S 5/06246* (2013.01); *H01S 5/1014* (2013.01); *H01S 5/1032* (2013.01); *H01S 5/124* (2013.01); *H01S 5/125* (2013.01); *H01S 5/14* (2013.01); *H01S 5/141* (2013.01); *H01S 5/142* (2013.01); *H01S 5/343* (2013.01); *H01S 5/3412* (2013.01); *H01S 3/08059* (2013.01); *H01S 3/106* (2013.01); *H01S 5/026* (2013.01); *H01S 5/06821* (2013.01)

(56) References Cited

U.S. PATENT DOCUMENTS

| | | | | |
|---|---|---|---|---|
| 2009/0274187 | A1* | 11/2009 | Kudo | H01S 5/026 372/49.01 |
| 2014/0153601 | A1* | 6/2014 | Doerr | H01S 5/041 372/44.01 |
| 2015/0288143 | A1* | 10/2015 | Choi | H01S 5/141 372/20 |
| 2015/0311672 | A1* | 10/2015 | Chaouch | H01S 5/0612 372/20 |
| 2016/0156149 | A1* | 6/2016 | Takabayashi | H01S 5/142 372/6 |
| 2017/0207600 | A1 | 7/2017 | Klamkin et al. | |
| 2018/0026426 | A1* | 1/2018 | Kawakita | G02B 5/284 372/20 |
| 2018/0269654 | A1 | 9/2018 | Zhang et al. | |

OTHER PUBLICATIONS

Duan et al., "Semiconductor quantum dot lasers epitaxially grown on silicon with low linewidth enhancement factor", Applied Physics Letters, vol. 112, Issue 25, 2018, pp. 251111-251114.

Hjelme et al., "Semiconductor Laser Stabilization by External Optical Feedback", IEEE Journal of Quantum Electronic, vol. 27, No. 3, Mar. 1991, pp. 352-372.

Lu et al., "Ultra-narrow linewidth quantum dot coherent comb lasers with self-injection feedback locking," Optics Express, vol. 26, Issue 9, Apr. 30, 2018, pp. 11909-11914.

Srinivasan et al., "Coupled-Ring-Resonator-Mirror-Based Heterogeneous III-V Silicon Tunable Laser", IEEE Photonics Journal, vol. 7, No. 3, Jun. 2015, 9 pages.

Yasaka et al., "FM Noise and Spectral Linewidth Reduction by Incoherent Optical Negative Feedback", IEEE Journal of Quantum Electronics, vol. 27, No. 2, Feb. 1991, pp. 193-204.

Bowers et al.; "Recent Advances in Silicon Photonic Integrated Circuits"; Feb. 13, 2016; 18 pages.

Lee, C.; "High Performance Quantum Dot Laser WDM Arrays for Optical Interconnects"; Jan. 17, 2012.

Norman et al.; "The future of Quantum Dot Photonic Integrated Circuits"; Mar. 1, 2018; 38 pages.

\* cited by examiner

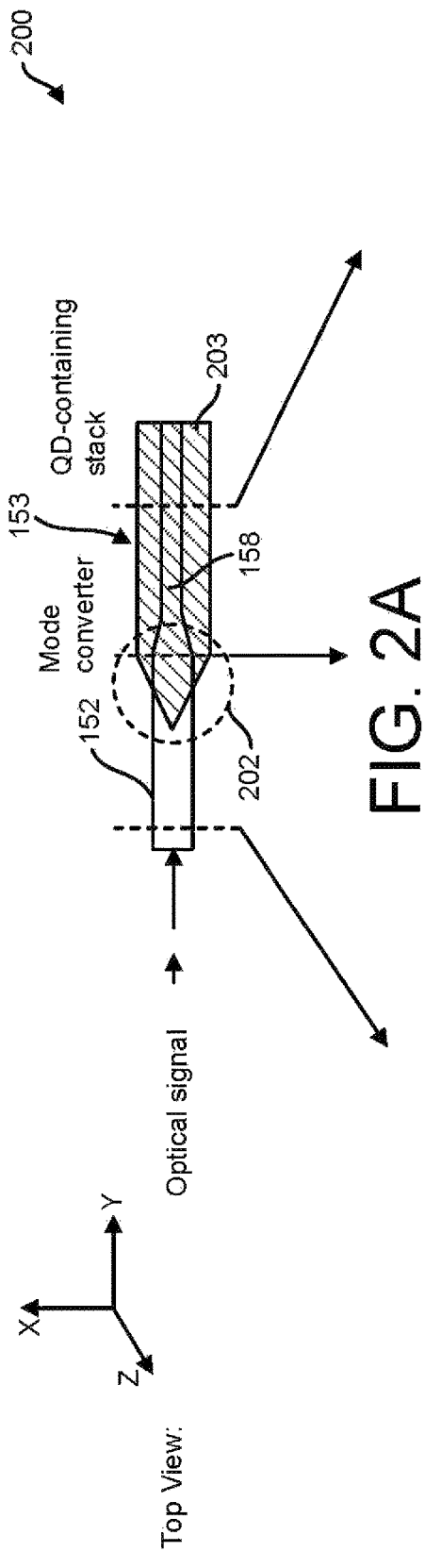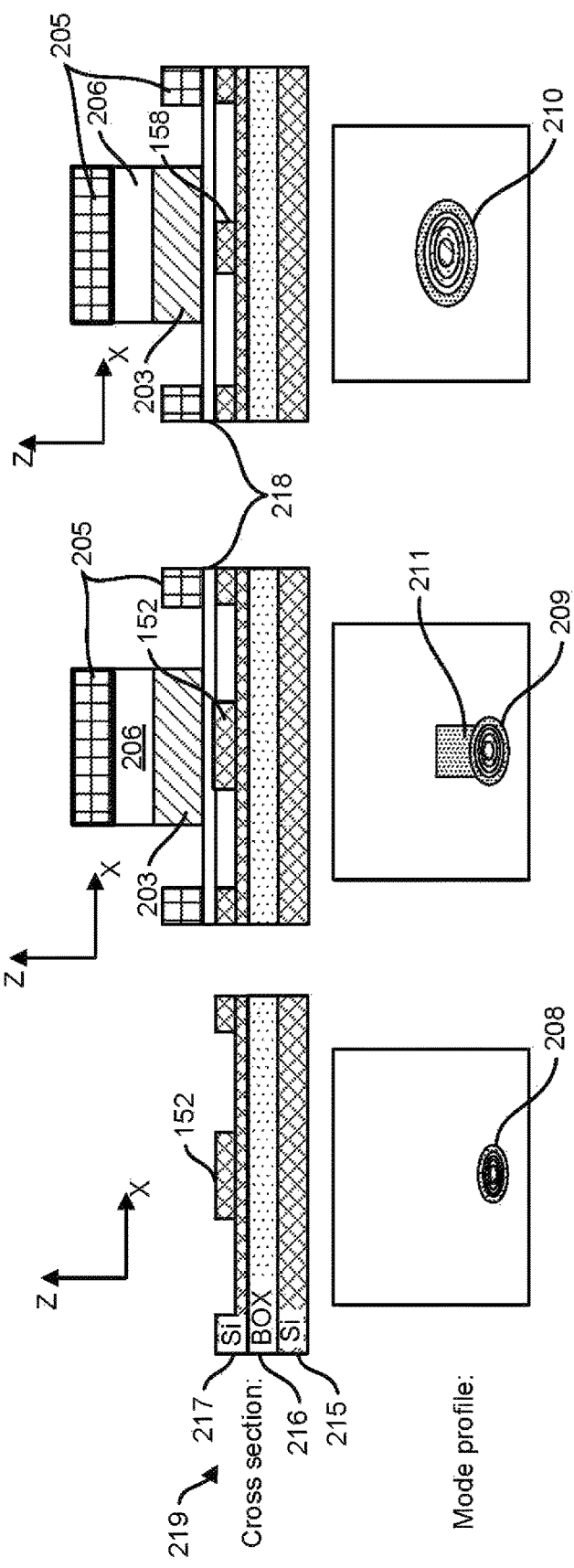

QUANTUM-DOT-BASED NARROW OPTICAL LINEWIDTH SINGLE WAVELENGTH AND COMB LASERS ON SILICON

STATEMENT REGARDING FEDERALLY SPONSORED RESEARCH OR DEVELOPMENT

This invention was made with government support under Agreement Number H98230-18-3-0001, awarded by the Maryland Procurement Office. The government has certain rights in the invention.

BACKGROUND

Optical systems may be used to manipulate optical signals in various ways. For example, photodetectors may absorb an optical signal and convert it into an electrical current. As another example, laser diodes may be used to generate lasers by applying a voltage across the diode's p-n junction to make it forward-biased. Narrow optical linewidth lasers may be used in light detection and ranging (LIDAR), coherent communications, and other applications.

BRIEF DESCRIPTION OF THE DRAWINGS

The following detailed description references the drawings, wherein:

FIGS. 2A-2D show examples of structural and layer details of the QDOA of FIG. 1B;

DETAILED DESCRIPTION

Figure 1A:
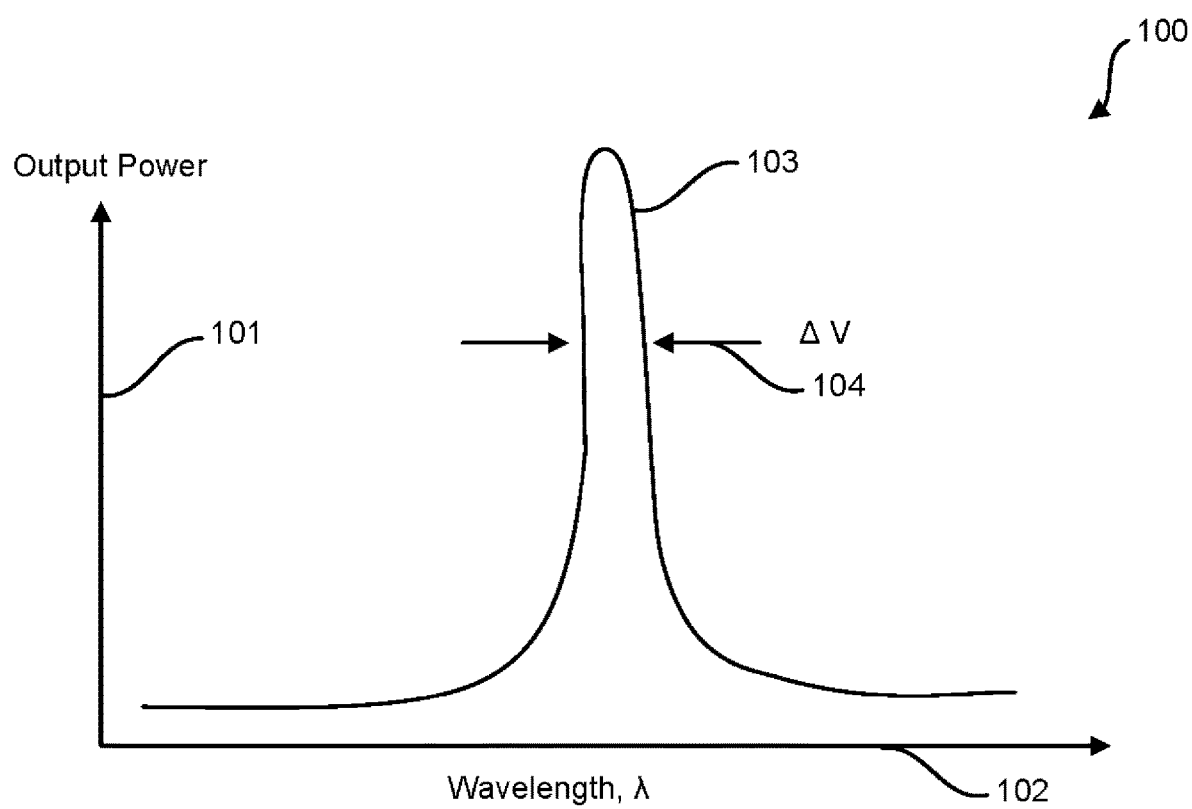
FIG. 1A shows an example optical spectrum of a single-wavelength, narrow optical linewidth laser.

The following detailed description refers to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

The terminology used herein is for the purpose of describing particular examples only and is not intended to be limiting. As used herein, the singular forms "a," "an," and "the" are intended to include the plural forms as well, unless the context clearly indicates otherwise. The term "plurality," as used herein, is defined as two or more than two. The term "another," as used herein, is defined as at least a second or more. The term "coupled," as used herein, is defined as connected, whether directly without any intervening elements or indirectly with at least one intervening elements, unless otherwise indicated. Two elements may be coupled mechanically, electrically, or communicatively linked through a communication channel, pathway, network, or system. The term "and/or" as used herein refers to and encompasses any and all possible combinations of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on. The terms "about" and "approximately", used interchangeably, mean up to 5% variation (plus or minus) from a given quantitative value following these terms. The term "adjacent," when applied to two components, regions, or layers, means no other components, regions, or layers, respectively, are physically interposed between the two components.

Optical systems generally include at least two types of components, those that generate or emit light, such as lasers, and those that detect light, such as photodetectors. Depending on the functions of the optical systems, the light transmitted within the system may represent a signal with certain predefined semantics or represent optically encoded data. An example of light as a signal is an optical alarm system which may detect light or lack thereof and interpret the signal as an alarm that a restricted area has been breached. Examples of light as encoded data include fiber optic systems used in high-performance computer systems and wide-area or local-area optical networking, which use optical media or links to carry encoded digital data from one source computer or storage to another one.

In some applications, such as LIDAR and coherent communications light is used to carry data, and the integrity of the data may depend on the optical linewidth of the laser beam. The optical linewidth indicates the purity of light frequency in a laser beam. A narrow optical linewidth is not a direct measure or indicator of the physical width of the laser beam (the same as the visual or geometric diameter of a laser dot projected on a surface), but rather, the indicator of what proportion of the laser beam is composed of a single light frequency or wavelength. Due to the nature and definition of laser, it is desirable to select a single light frequency or wavelength for the laser without other stray light wavelengths that reduce laser beam, coherence, intensity, power density, and effectiveness. In a coherent optical transmission system, an optical receiver can track phase and frequency information embedded in the optical signal. A narrow-optical linewidth laser beam that can be tuned to a particular frequency can act as a local oscillator, providing phase coherence and allowing the extraction of phase information by the optical receiver.

Accordingly, a laser device that generates a narrower optical linewidth laser beam compared with other technologies allows faster communications with lower error rate.

Examples disclosed herein describe a QDOA-based laser generation device that may be used to narrow the laser beam width and enhance LIDAR applications and coherent communications. The laser beam optical linewidth may be further narrowed by using optical feedback to select output laser beam wavelength and, as further described below.

In one example implementation, a narrow-optical linewidth laser generation device is disclosed including a single-wavelength mirror coupled with a QDOA, which is in turn coupled with a phase tuner and broadband mirror. A laser cavity is a section formed between the single-wavelength mirror and the broadband mirror, which narrows the laser beam optical linewidth. The single-wavelength mirror may be implemented using two optical ring resonators and an optical splitter/coupler. The broadband mirror may be made using a distributed Bragg reflector (DBR). The rings are selected to have slightly different free spectral ranges (FSR), which result in narrower optical linewidth laser beam due to decreased distributed mirror loss. The phase tuner is tuned to select a wavelength on the longer wavelength side of the mirror reflectivity spectrum peak, which further narrows the laser optical linewidth due to integrated negative optical feedback.

In another disclosed example implementation, a multi-wavelength narrow optical linewidth comb laser device is described. The device may include a multiple-wavelength mirror coupled with a coupled with a QDOA, which is in turn coupled with a phase tuner and broadband mirror. A laser cavity is formed between the multiple-wavelength mirror and the broadband mirror, which narrows the laser beam optical linewidth. The multiple-wavelength mirror may be implemented using an optical ring resonator and a splitter. The broadband mirror may be made using a DBR. Negative optical feedback may be used to narrow the optical linewidth of the output laser beam.

In still another disclosed example implementation, a multi-wavelength narrow-optical linewidth comb laser generation device is described. The device may include a front DBR-based mirror coupled with a coupled with a QDOA, which is in turn coupled with a back DBR-based mirror. An external ring resonator may be used to create a resonant cavity and resonant optical feedback to narrow all comb lines.

Also described is a QDOA built on a silicon waveguide to create an effective optical amplifier that is integrated with the laser generation device. Quantum-dot lasers have inherently a lower optical linewidth enhancement factor than the quantum-well lasers. The QDOA may be made by creating or forming several distinct layers on the passive silicon waveguide including one or more quantum dot (QD) light amplification and/or generation layers. A QDOA may have three distinct sections along its length. One section is a silicon waveguide section, a second section is a mode conversion transition section, and a third section is a QD section. Light first enters the silicon waveguide section, then crosses the mode conversion transition section in which the silicon waveguide tapers down and becomes narrower, and the light amplification/generation layer starts small and narrow and then gradually widens and becomes wider In some example implementations, the QDOA includes several layers of QDs separated by spacer layers of material such as Gallium Arsenide (GaAs).

Besides a narrow-width laser beam, another advantage of QDOA is a solution to some manufacturing complexity problems. Specifically, the same material stack as a diode laser may be used to manufacture the QD-based photodetectors. Also, the same design and manufacturing techniques may be used to manufacture both the QD-based photo detectors and QD comb laser and ring laser devices resulting in high-performance photodetectors and lasers. More specifically, simple integration of lasers and photodetectors manufactured this way, using a single bonding step with no selective area bonding, and no high temperature growth steps is possible. Hence, in the same manufacturing process, different devices may be manufactured less expensively that may be integrated more easily in various applications.

Another advantage of QDOA integrated on silicon described herein is efficient coupling between passive silicon waveguides, which reduces cost and complexity of systems and system data interfaces.

Turning now to the drawings, FIG. 1 shows an example optical spectrum 100 of a single-wavelength, narrow optical linewidth laser. The example optical spectrum 100 is shown as an optical spectrum curve 103 in a reference frame having an output power vertical axis 101 and a wavelength horizontal axis 102. A laser optical linewidth 104 ($\Delta v$) is defined as a width of the optical spectrum curve 103, as shown. Laser optical linewidth 104 generated based on QDOA is inherently narrower than those generated based on quantum-well structure optical gain material.

The optical linewidth of a laser is a measure of its wavelength, frequency, or phase stability. Generally, the narrower the optical linewidth of a laser beam, the more stable the laser beam. Narrow optical linewidth lasers are advantageous in coherent applications such as coherent communication and LIDAR.

The optical linewidth of a laser can be calculated by $$\Delta v = \frac{hfv_g^2(\alpha_i + \alpha_m)\alpha_m n_{sp}}{8\pi P_{out}}(1 + \alpha_H^2) \qquad (1)$$

Where hf, $v_g$, $\alpha_i$, $\alpha_m$, $n_{sp}$, $P_{out}$, and $\alpha_H$ are the photon energy, group velocity, intrinsic loss, distributed mirror loss, population inversion factor, output power, and optical linewidth enhancement factor, respectively. Hence, to narrow down the optical linewidth 104 of a laser beam, one or more of the parameters shown in the numerator of Equation (1) may be decreased, and/or output power ($P_{out}$) may be increased. A technique that may be used to narrow down the optical linewidth 104 is to use a longer optical cavity (as compared with a shorter optical cavity), the distance between the two mirrors deployed on the two sides of the QDOA, a first end (side) and a second end (side), which in effect decreases distributed mirror loss ($\alpha_m$).

As shown in Equation (1), the optical linewidth depends on the distributed mirror loss and the optical linewidth enhancement factor. Typical optical linewidth narrowing techniques use a long cavity, which effectively decreases $\alpha_m$.

Figure 1B:
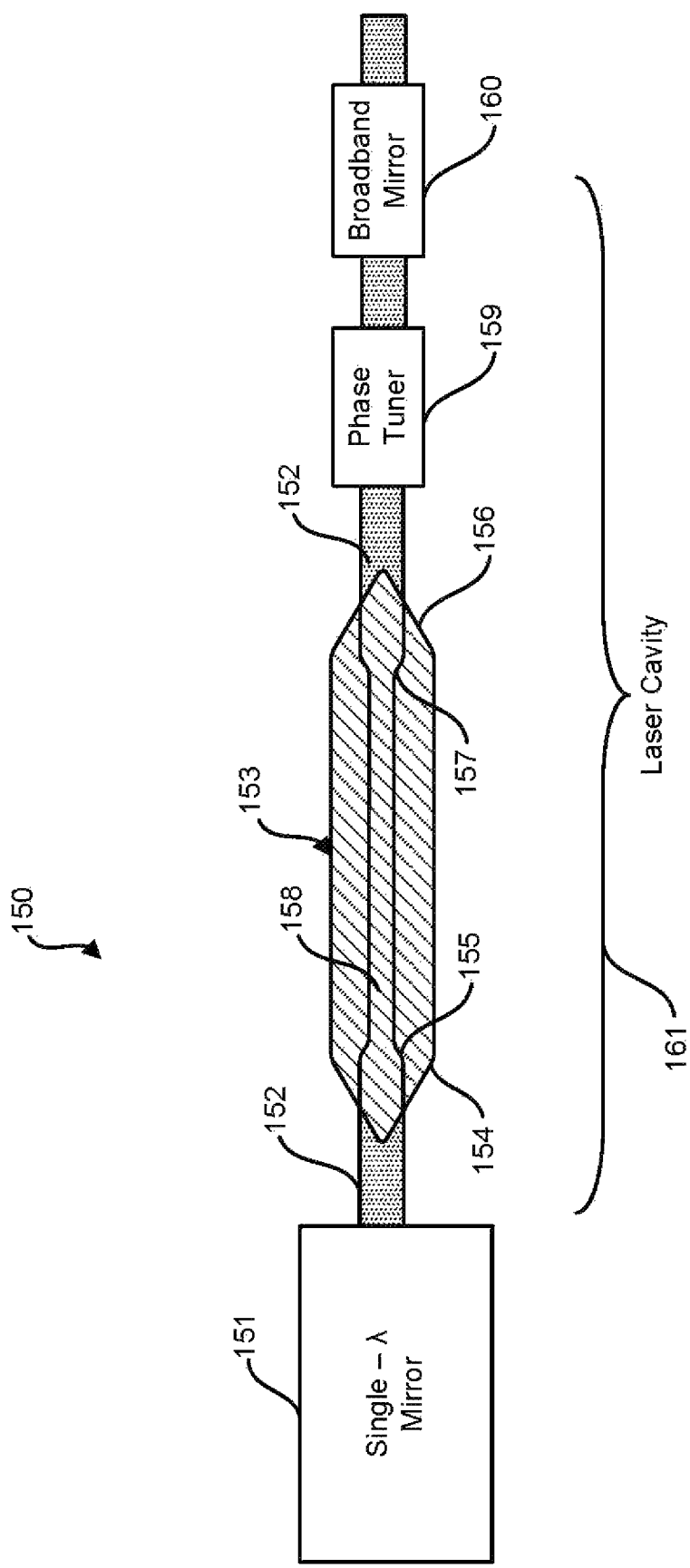
FIG. 1B shows an example single-wavelength, narrow optical linewidth laser generation device using a quantum dot optical amplifier (QDOA)

FIG. 1B shows an example single-wavelength, narrow optical linewidth laser generation device 150 using the QDOA 153. In some example implementations, the laser generation device 150 includes a single-wavelength mirror 151 coupled with the QDOA 153 having a passive waveguide 152 tapering down to a narrow portion 158 via a sloped portion 155 and widening up again to its previous width via a slope 157. A QD stack layer starts from a point adjacent to the passive waveguide 152 and continues via a slope 154, near slope 155, and narrows down again via a slope 156, near slope 157, to an endpoint. The tapered area shown as slopes 154 and 155 are spaced apart from the other tapered area shown as slopes 156 and 157 along the linear axis passing through the two tapered areas. The passive waveguide 152 is coupled with phase tuner 159 and also with broadband mirror 160. The interval between the single-wavelength mirror 151 and the broadband mirror 160 is referred to as a laser cavity 161. As noted above with respect to Eq. (1), an effectively longer laser cavity 161 (as compared with a shorter one) results in a narrower laser optical linewidth. The single-wavelength mirror 151 is deployed at the input of the narrow optical linewidth laser generation device 150, while the broadband mirror 160 is deployed at the output of the laser device. A more detailed example implementation of the single-wavelength, narrow optical linewidth laser generation device 150 is further described with respect to FIG. 3 below.

FIGS. 2A-2D show examples of structural and layer details of a QDOA 153 that may be included in the optical system disclosed herein. In some example implementations, with reference to FIG. 2A, QDOA 153 includes a passive waveguide 152 that extends to a mode converter 202 position or location within the QDOA 153, as further defined below, and narrows down to a narrower waveguide 158, overlaid with a QD stack 203.

In some example implementations, the passive waveguide 152 may be made of silicon, which may also function as a substrate for other layers, as further described below. The passive waveguide 152 tapers down in the proximity of the QD stack 203 widening. The taper angles with respect to Y-axis may be between about 1° and about 90°. This proximity where the dual tapers take place forms the mode converter 202 in which the light is directed to the QD stack 203 from the passive waveguide 152, as further described with respect to FIGS. 2B-2C below. FIG. 2A is shown in the X-Y plane as indicated by the X-Y-Z reference frame. The QDOA 153 includes three distinct areas or sections along the Y-axis, including a first section having the passive waveguide 152 (on left of FIG. 2A) at full width, which takes light as its input and carries the light to the mode converter 202. The second section, the mode converter 202, is defined by a narrowing of the passive waveguide 152, which creates a narrowed waveguide section, and the starting and widening of the QD stack 203, which creates a widened QD stack section. So, the mode converter 202 includes portions of the passive waveguide 152 having a tapered region leading to the narrow section 158 of the waveguide, and portions of the QD stack 203 having a sloped region (or having a reverse taper—a taper in the opposite direction—with respect to the tapered region of the waveguide 152) leading to a widened section of the QD stack 203, as shown in FIG. 2A, The third section includes the narrowed waveguide 158 and full width, without taper, QD stack 203. The cross sections of these three areas, in X-Z plane, are shown in FIGS. 2B-2G that follow.

With continued reference to FIG. 2A, the QDOA 153 disclosed herein includes a QD light generating/amlifying material. The QD light amplification material may be or may include various III-V semiconductors (with reference to Groups III-V of the periodic table of elements), for example, Indium Arsenide (InAs), GaAs, Indium Phosphorus (InP), and the like, and may be bonded on top of the passive waveguide 152. Light may be coupled from the passive waveguide 152 to enter the QD stack 203 using the mode converter 202. Multiple such light amplification/generation layers may be formed in the QD stack 203.

According to one or more implementations, FIG. 2B shows an example cross-section in X-Z plane at the first section of the QDOA structure 200, as shown in FIG. 2A, which includes passive waveguide 152 and QDOA 153. The QDOA 153 layers shown include a substrate 219 having a lower silicon layer 215 at the bottom, a buried oxide (BOX) layer 216 in the middle, and an upper silicon layer 217 at the top, arranged with respect to the X-Z reference frame shown. The passive waveguide 152 is created on top of the silicon substrate 219. The number and arrangement of these components are examples only and provided for purposes of illustration. Other arrangements and numbers of components may be utilized without departing from the examples of the present disclosure. A light mode profile 208 shows a spatial light distribution of a certain size at this cross-section, which is restricted to the silicon waveguide. The light mode profile changes as the QDOA 153 is traversed along the Y-axis.

Continuing on to the second cross-section of the three QDOA structure 200 sections, according to one or more implementations, FIG. 2C shows a cross-section at the mode converter 202 of FIG. 2A. The substrate 219 cross-section is as described with respect to FIG. 2B above. The passive waveguide 152 is layered on top of the silicon substrate 219. The width of the passive waveguide 152, along the X-axis, remains the same as the first section before the taper starts. The next layer on top of the passive waveguide 152 is an N-cladding 218. Next, the QD stack 203 is added on top of the N-cladding 218. The structure of the QD stack 203 is further described below with respect to FIGS. 2E and 2F. A P-cladding 206 is the next layer on top of the QD stack 203. A metal electrical contact layer 205 is added on top of the P-cladding 206 to inject current into the QDOA structure. A mode profile 209 of the light in this section is different from the mode profile 208 of the first section. In this mode profile, a light outflow 211 is spatially expanded into the light amplification/generation region along Z-axis defined and occupied by the QD stack 203. The light outflow 211 thus entering the QD stack 203 is the input to the p-n junction that when forward-biased causes the light amplification and generation.

With reference to FIGS. 2A to 2C, the width of passive waveguide 152 included in the QDOA structure 200 along the X-axis of FIGS. 2B and 2C may range from about 300 nm to about 2 μm and the thickness of passive waveguide 152 along the Z-axis may range from about 200 nm to about 500 nm. The width of the QD stack 203, except in the sloped or tapered region, may range from about 1 μm to about 10 μm and the thickness of the QD stack 203 may range from about 100 nm to about 500 nm. The width of the QD stack 203 along the X-axis may generally be greater than the width of passive waveguide 152 at any of its varying widths.

Now, with reference to FIG. 2D, a cross-section of the third section of the QDOA 200 is the same as FIG. 2C, except for the width of the passive waveguide 152, which is now reduced, as shown in FIG. 2A also. Accordingly, a mode profile 210 of the light is also changed to a spatially more expanded form and further inside an area of the QD stack 203.

Figure 3:
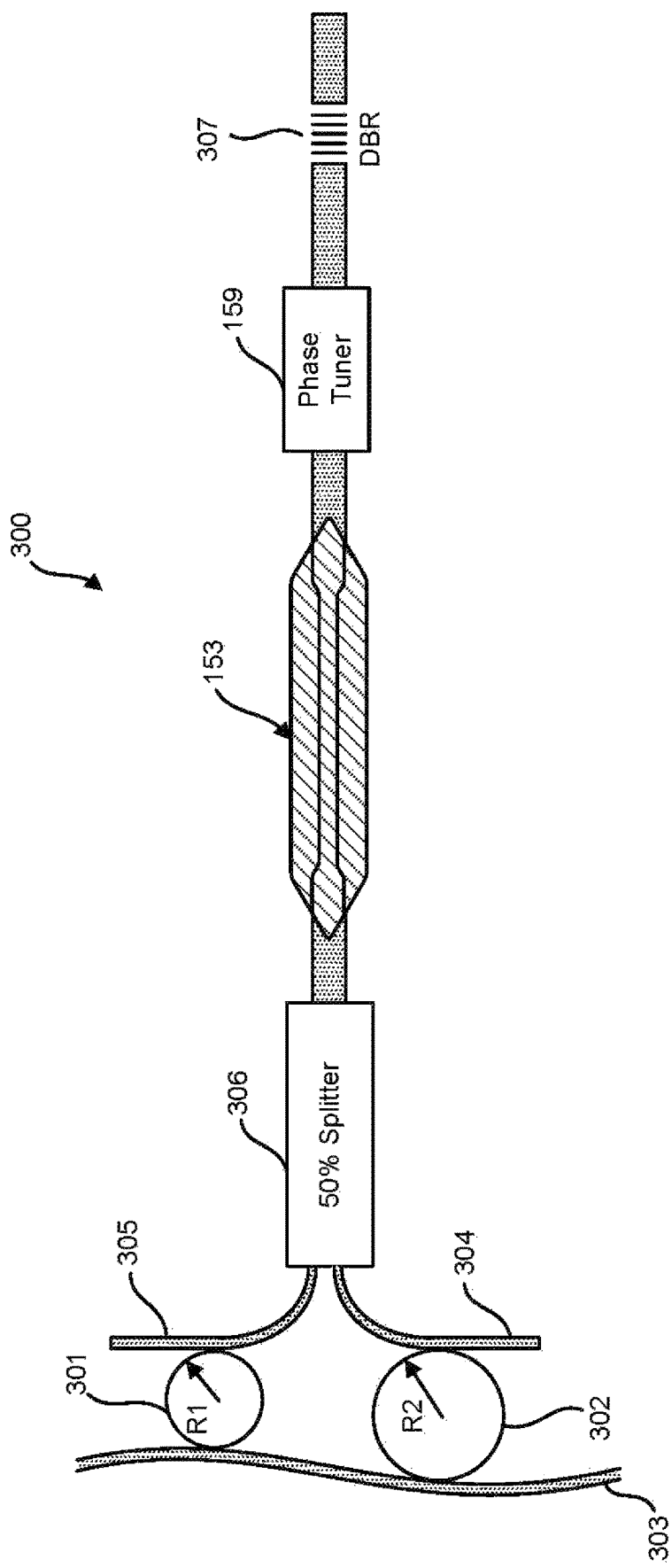
FIG. 3 shows an example implementation of the laser generation device of FIG. 1B.

FIG. 3 shows an example implementation 300 of the laser generation device 150 of FIG. 1B. The basic structure of and configuration of the laser generation device 150 is the same as depicted in FIG. 1B, however, a more detailed implementation is shown. Specifically, the single-wavelength mirror 151 may be implemented using two ring resonators 301 and 302, with radius R1 and radius R2, respectively. The radii of the ring resonators 301 and 302 may range from 5 μm to 500 μm in size. Those skilled in the art will appreciate that the size of the radius may be outside this range depending on various design parameters for a particular device and/or application. The difference in size between R1 and R2 may be between 0.1 μm and 10 μm. This difference may also be outside this range depending on various design parameters for a particular device and/or application. The ring resonators 301 and 302 are coupled on one point along their perimeters with an input optical waveguide 303, and on another point along their perimeters with respective coupling optical waveguides 304 and 305, which are in turn coupled with a 50% splitter 306, a single mode 1×2 fiber optic splitter/coupler. The 50% splitter 306 is coupled with QDOA 153, and further coupled with phase tuner 159. The phase tuner 159 may be coupled with a DBR 307 (for example, one implementation of the broadband mirror 160.)

The ring resonators 301 and 302 constituting the single-wavelength mirror 151, may have slightly different radii R1 and R2 and correspondingly slightly different free spectral ranges (FSR), where $FSR_{ring1}$ corresponds to ring resonator 301 and $FSR_{ring2}$ corresponds to ring resonator 302 in the equations below. The FSR of the single wavelength mirror 151 (identified by $FSR_{vernier}$) is given by the following equation:

$$FSR_{vernier} = \frac{FSR_{ring1} FSR_{ring2}}{FSR_{ring1} - FSR_{ring2}} \quad (2)$$

Where $$FSR_{rng} = \frac{\lambda^2}{Ln_g} = \frac{\lambda^2}{2\pi R n_g} \quad (3)$$

With R and $n_g$ being the ring radius and the group index of the ring resonators 301 and 302, respectively. If $FSR_{vernier}$ is larger than the gain bandwidth of the QDOA 153, the laser will operate at a single wavelength as described below with respect to FIGS. 5A-5C. FSR is the spacing, distance, or difference in frequency or wavelength between two successive optical intensity maxima (or minima) of reflected or transmitted optical signals.

With continued reference to FIG. 3, in this example implementation the ring resonators 301 and 302 effectively increase the length of the laser cavity 161 because resonant light waves entering the rings get trapped and travel around the rings several times before entering QDOA 153 via waveguides 305 and 304, respectively. This traveling of the light around the ring resonators 301 and 302 is equivalent to light traveling along a longer linear path with an equivalent delay. And since a longer cavity provides a narrower optical linewidth, this example implementation also creates a narrower optical linewidth, by creating a longer effective length for the laser cavity 161. With reference to Eq. (1), $\alpha_m$, the distributed mirror loss, is defined as follows:

$$\alpha_m = \frac{1}{2L} \ln\left(\frac{1}{(R1R2)}\right) \quad (4)$$

Where L, $R_1$, and $R_2$ are the length of the laser cavity 161, and the mirror reflectivities, respectively. Therefore, a larger L creates a smaller $\alpha_m$, which in turn produces a smaller optical linewidth. As noted above, in a ring resonator, if designed correctly with the appropriate parameters and dimensions, light that is on resonance gets trapped in the ring for a relatively long time before coupling out of the ring to waveguides, hence, creating a longer effective laser cavity 161. The operation of ring resonators to separate frequencies (or wavelengths) is described below with respect to FIG. 4, below.

Figure 4:
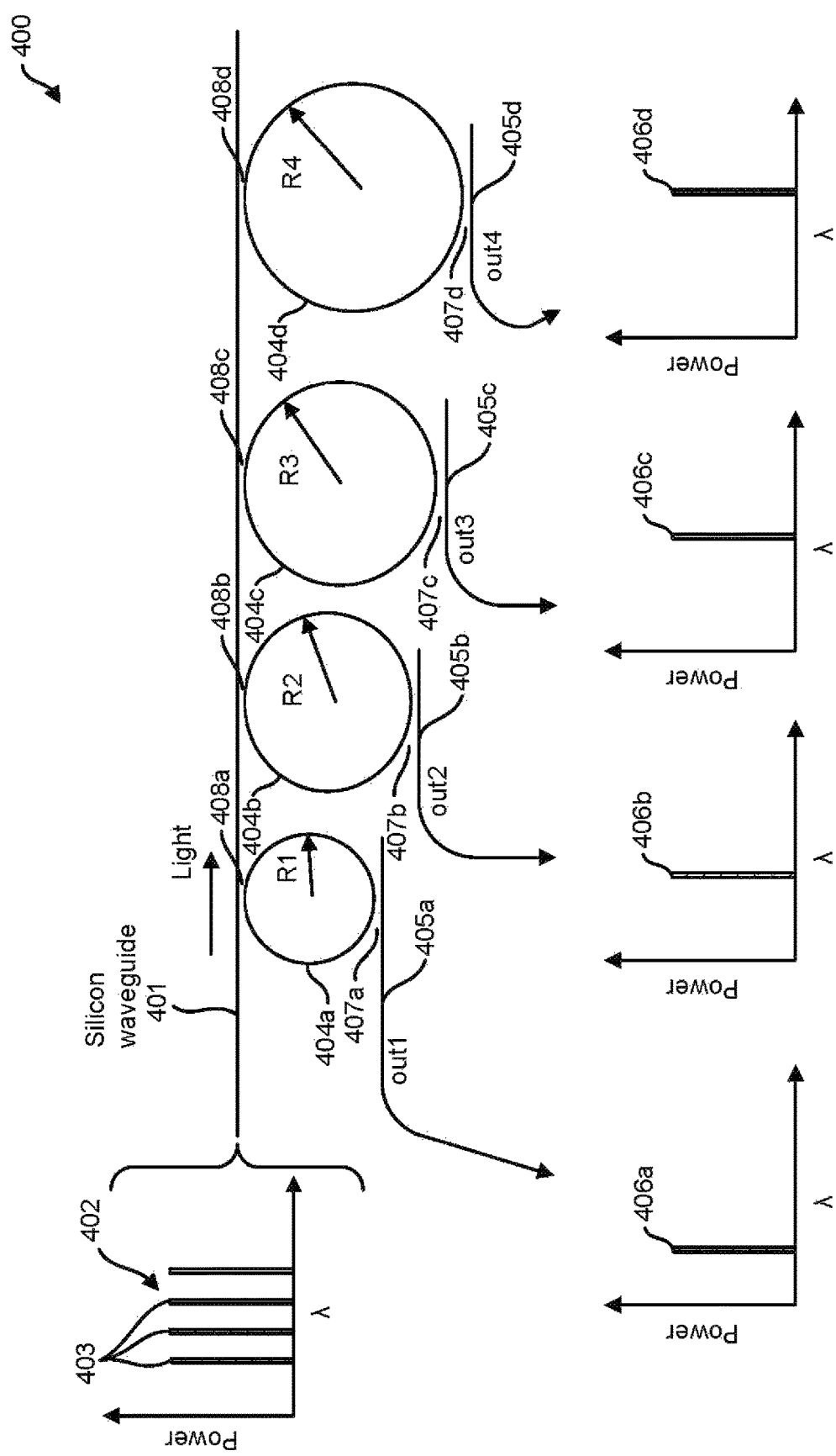
FIG. 4 shows examples of evanescent coupling between a waveguide and several ring resonators of various sizes to pass through various corresponding wavelengths.

FIG. 4 shows examples of evanescent coupling 400 between a waveguide and several (optical) ring resonators of various sizes to pass through various corresponding wavelengths. As noted above, a laser generation device, such as a laser generation device 150, may be used to transmit data. The data may be modulated on the laser beam using various techniques. Several light frequencies, or equivalently, wavelengths λ, may be generated by the laser device, for example, a comb laser, and combined and transmitted over one optical media, such as waveguide 152 (FIG. 1B). A wavelength vs. power graph 402 shows several distinct carriers with different wavelengths 403 being transmitted via a waveguide 401. A number of (optical) ring resonators 404a-404d each having a different radius R1-R4, respectively, are coupled with the waveguide 401 via evanescent coupling through small air gaps 408a-408d, respectively, on the order of about 0.2 μm or more or less as desired. The radii of the ring resonators 404a-404d may range from 5 μm to 500 μm in size. Those skilled in the art will appreciate that the size of the radius may be outside this range depending on various design parameters for a particular device and/or application. The ring resonators 404a-404d are further coupled with waveguides 405a-d, via other air gaps 407a-407d, respectively. Each of the waveguides 405a-405d receives the corresponding data stream with distinct carrier wavelengths 406a-406d, from the respective ring resonators 404a-404d.

Optical evanescent coupling is used to transfer light between an optical transport, such as a waveguide, to semiconductor devices, such as photodetectors that use or process the light. The ring resonators 404a-404d inherently operate in a narrow bandwidth by resonance. As a result, the rings may be tuned to particular frequencies. In practice, the tuning is done by choosing the appropriate radius for the waveguide rings and can be further fine-tuned by a heater and/or a MOS-tuner (metal oxide semiconductor tuner). This way, each ring separates a particular carrier with the frequency tuned to the radius of the ring, which is subsequently passed on to the corresponding waveguide.

Figure 5A:
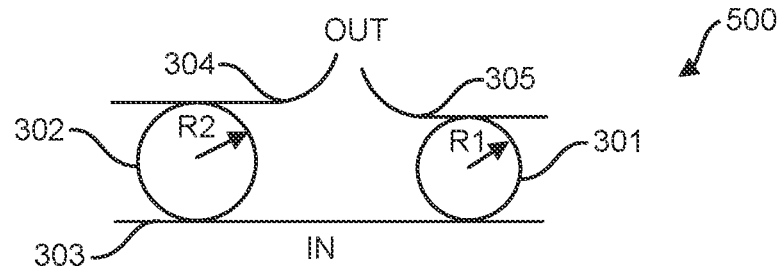
FIG. 5A shows an example implementation of a single-wavelength mirror.

FIG. 5A shows an example implementation of a single-wavelength mirror 500. As described above with respect to FIG. 3. The components constituting the single-wavelength mirror 500 include ring resonator 301, ring resonator 302, both coupled with input optical waveguide 303 on the input side, and each coupled with optical waveguides 305 and 304 on the output side to the 50% splitter 306 (see FIG. 3), respectively. As noted above with respect to FIG. 3, if the $FSR_{vernier}$, calculated according to Eq. (2), is larger than the gain bandwidth of the QDOA, the laser beam will operate at the single peak wavelength, as further discussed below.

Figure 5B:
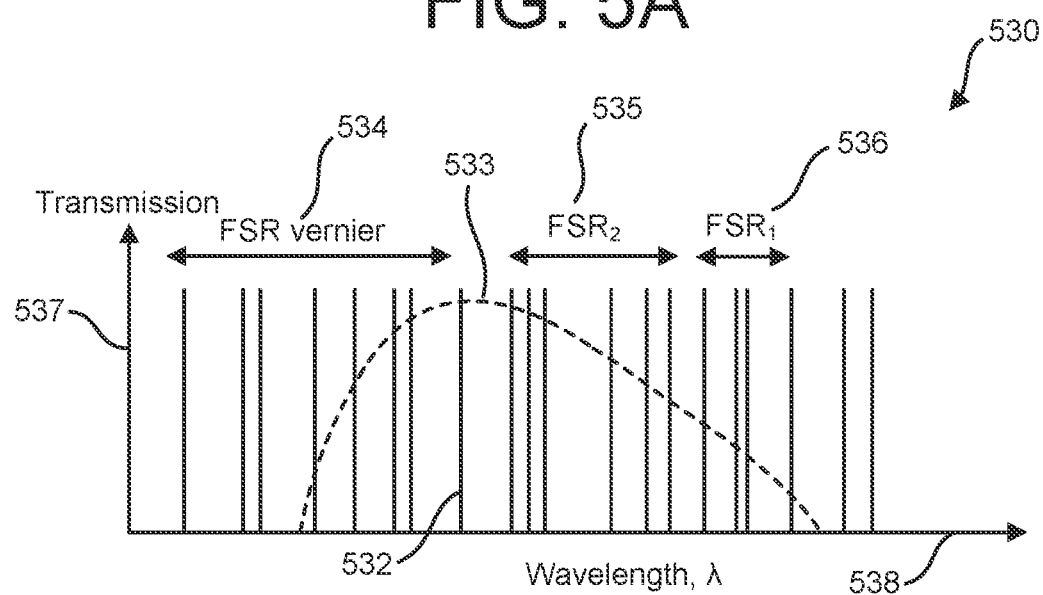
FIG. 5B shows an example wavelength transmission spectrum for free spectral range (FSR) corresponding to ring resonator 1, ring resonator 2, and Vernier FSR.

FIG. 5B shows an example wavelength transmission spectrum 530 for the FSR corresponding to ring resonator 301, ring resonator 302, and Vernier FSR (for example, $FSR_{Vernier}$). The wavelength transmission spectrum 530 includes a reference frame having a vertical transmission axis 537, a horizontal wavelength axis 538, $FSR_1$ spectral range 536, $FSR_2$ spectral range 535, $FSR_{vernier}$ spectral range 534, a gain spectrum 533, and a peak gain spectrum wavelength (or frequency) 532. Since the $FSR_{vernier}$ spectral range 534 is larger than the gain spectrum 533 of the QDOA, only one wavelength, will lase in this configuration. The lasing wavelength does not necessarily have to coincide with the peak gain spectrum wavelength 532.

Figure 5C:
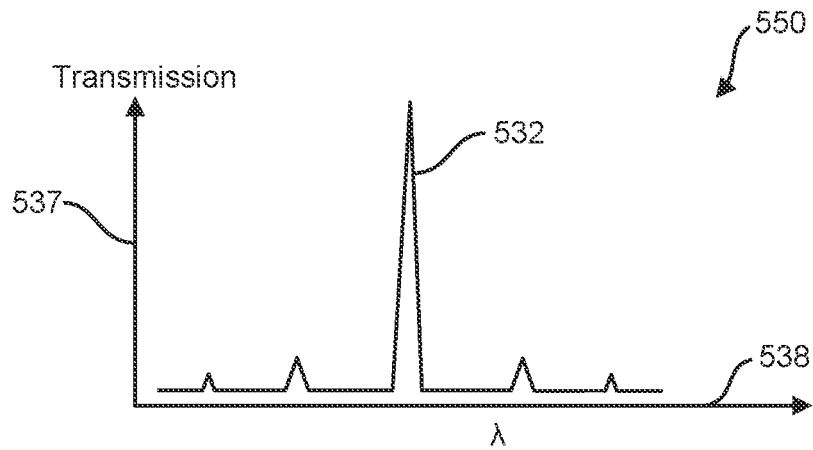
FIG. 5C shows an example transmission spectrum at an output of the laser generation device of FIG. 1B.

FIG. 5C shows an example transmission spectrum 550 at an output of the laser generation device of FIG. 1B. When the two ring resonators 301 and 302 are used as shown in FIGS. 3 and 5A, the output laser beam will operate at the peak gain spectrum wavelength 532, at a narrow optical linewidth corresponding to a long laser cavity.

Figure 6:
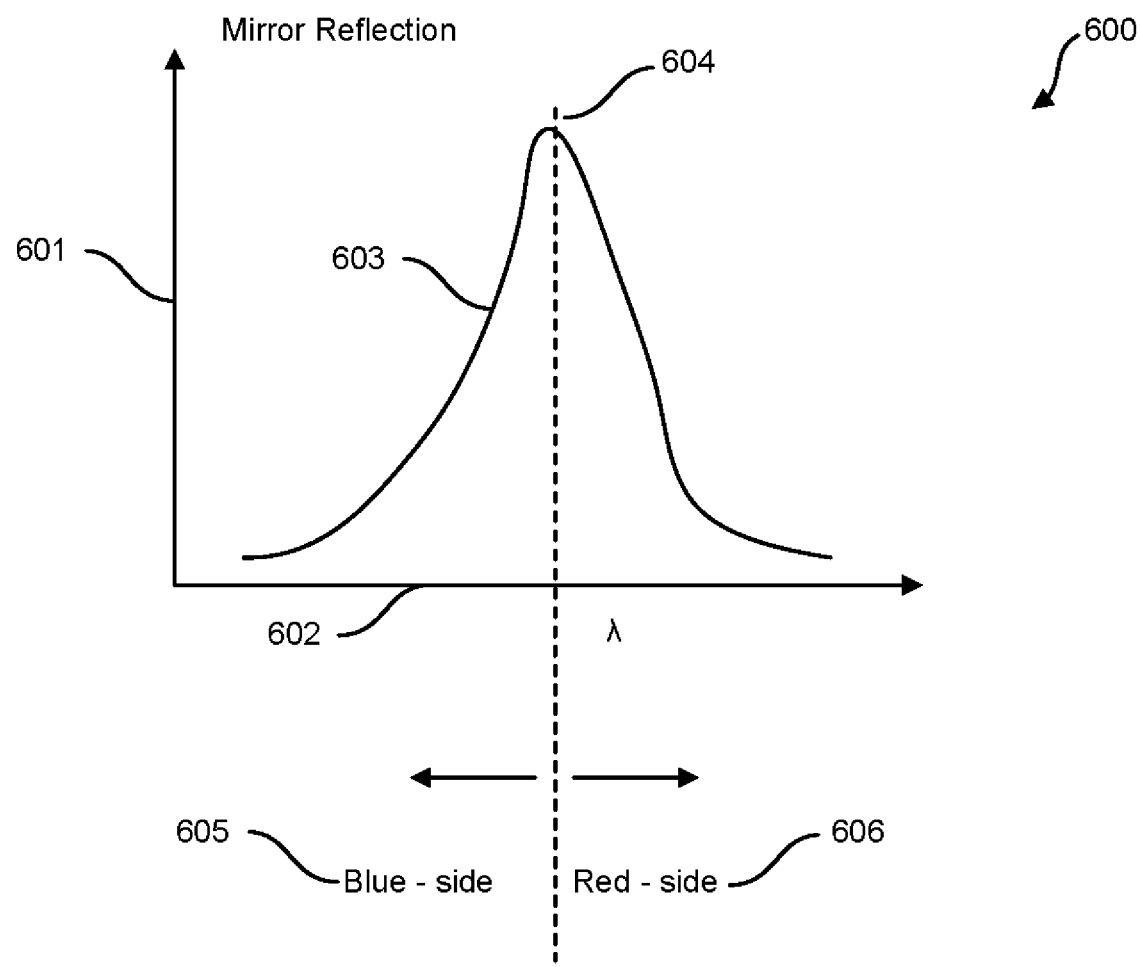
FIG. 6 shows an example negative optical feedback to further narrow the output laser optical linewidth.

FIG. 6 shows an example negative optical feedback 600 to further narrow the output laser optical linewidth. The elements that allow a negative feedback are shown within a reference frame having mirror reflection vertical axis 601 and wavelength horizontal axis 602. Mirror reflection spectrum 603, having a mirror reflection peak 604, is shown within this reference frame. The reference frame may be divided into two regions, a blue-side 605 and a red-side 606. The blue-side (or blue light wavelengths) 605 region covers the wavelengths less than the peak 604, and the red-side (red light wavelengths) 606 covers the wavelengths greater than the peak 604 as shown in FIG. 6.

To reduce the optical linewidth of the laser further, a negative optical feedback technique may be used. Rather than operate the laser beam at the mirror reflection peak 604, or peak gain spectrum wavelength 532, the phase tuner 159 may be tuned to cause the lasing wavelength to fall slightly off the mirror reflection peak 604, on the red-side 606, as shown in FIG. 6. If the laser beam is tuned to the longer wavelength, red-side 606 of the mirror reflection peak 604, a small increase in the wavelength (due to frequency noise) may reduce the mirror reflectivity. This reduces the number of photons in the laser cavity 161 which will increase the number of electrical carriers. This will, in turn, reduce the refractive index because of a plasma dispersion effect, thus reducing the operating wavelength of the output laser. This process may partly cancel an initial wavelength increase that may have been caused by the laser's frequency noise. Tuning the laser to the blue-side 605 of the mirror reflection peak 604 will increase the initial frequency noise of the laser, which is not desirable.

Figure 7A:
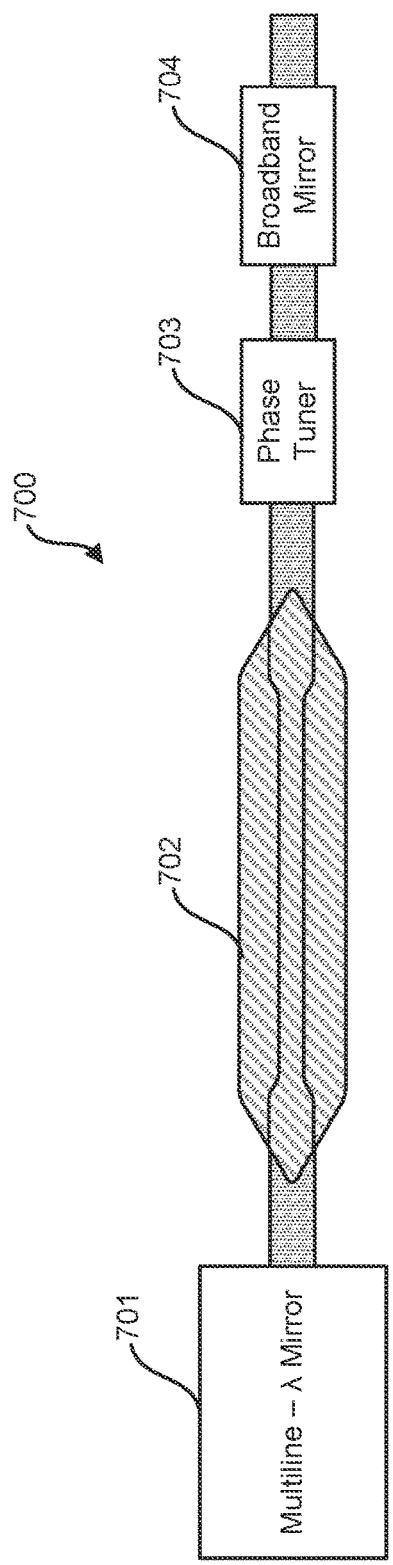
FIG. 7A shows an example narrow-optical linewidth comb laser generation device using a QDOA.

FIG. 7A shows an example narrow-optical linewidth comb laser generation device 700 using a QDOA 702. The narrow-optical linewidth comb laser generation device 700 is similar to the single-wavelength, narrow optical linewidth laser generation device 150 in overall structure, with one difference in the mirror on the input side of the laser device. The narrow optical linewidth comb laser generation device 700 includes a multiple-wavelength mirror 701 coupled with a QDOA 702, which is in turn coupled with a phase tuner 703 and broadband mirror 704. A more detailed example implementation is described with respect to FIG. 7B.

Figure 7B:
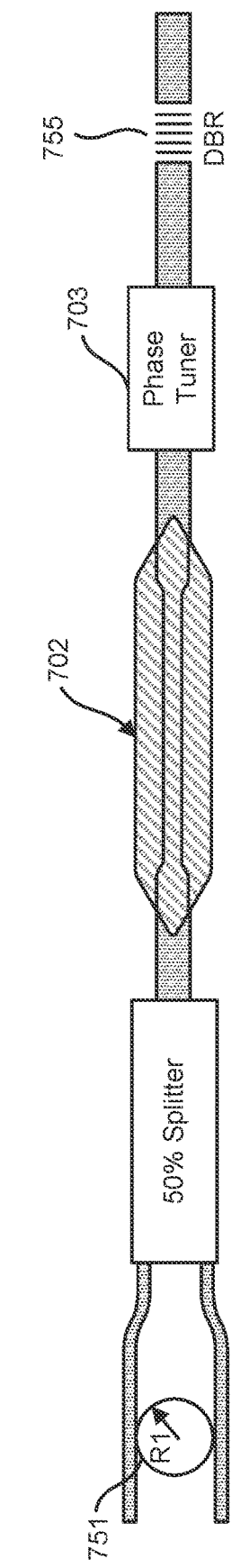
FIG. 7B shows an example implementation of the narrow-optical linewidth comb laser generation device of FIG. 7A.

Some narrow-optical linewidth lasers use a single wavelength configuration to provide as much power into one wavelength as possible. This is because multiwavelength operation in quantum-well lasers may result in mode partition noise, a type of amplitude noise, which is generally undesired. Since QD-based lasers are less prone to mode partition noise, the same techniques discussed above with respect to single-wavelength, narrow optical linewidth laser generation device 150 may be used to construct a narrow optical linewidth comb (multiwavelength) laser as shown in FIGS. 7A and 7B. The phase tuner 703 may be used to tune the lasing wavelengths of the multiwavelength comb laser to the red-side 606 (see FIG. 6) of the respective reflection peaks, for each wavelength. These techniques may further reduce the laser optical linewidth. The multiple-wavelength mirror 701 allows multiple optical signals with various wavelengths to go through the QDOA 702 to create the comb laser.

FIG. 7B shows an example implementation 750 of the narrow optical linewidth comb laser generation device 700 of FIG. 7A. This implementation includes a ring resonator 751 coupled with a 50% splitter, which is in turn coupled with the QDOA 702, phase tuner 703 and DBR 755. The DBR 755 is an example implementation of the broadband mirror 704 of FIG. 7A.

In some example implementations of this configuration, $FSR_1$, corresponding to ring resonator 751, may be chosen to be between 50 GHz and 80 GHz. While other values outside this range may also work, if the $FSR_1$ is too small, the signal may have a larger insertion loss and cross talk in a modulator (to create data signals carried by the laser beam—see FIG. 4), while if the $FSR_1$ is too large, the available optical bandwidth may not be fully utilized.

Figure 8:
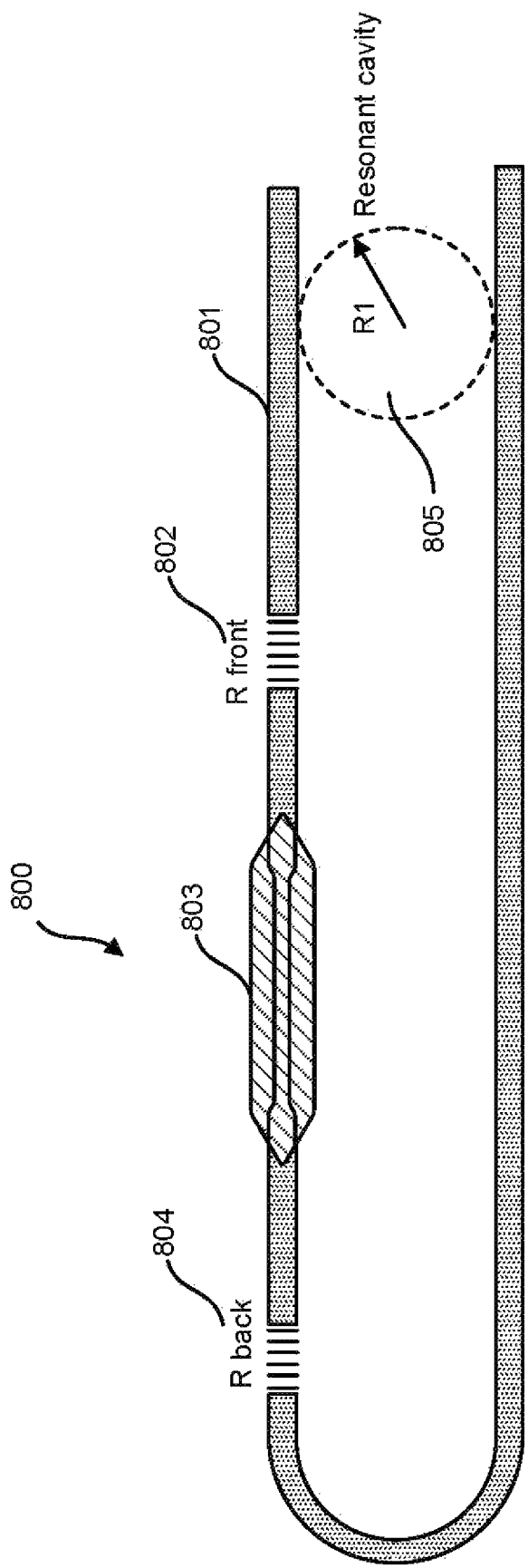
FIG. 8 shows another example implementation of a narrow-optical linewidth comb laser generation device using an external ring resonator.

FIG. 8 shows another example implementation of a narrow-optical linewidth comb laser generation device 800 using an external ring resonator 805. In an example implementation, narrow-optical linewidth comb laser generation device 800 includes a passive waveguide 801 coupled with a front DBR 802, in turn coupled with a QDOA 803, and further coupled with a back DBR 804. The external ring resonator 805 is coupled with the passive waveguide 801 to create a resonant cavity. These techniques result in narrow optical linewidth output laser beams, as described herein.

The foregoing disclosure describes a number of example implementations of narrow optical linewidth laser devices, both single-wavelength and multiwavelength or comb lasers. For purposes of explanation, certain examples are described with reference to the components illustrated in FIGS. 1 to 8. The functionality of the illustrated components may overlap, however, and may be present in a fewer or greater number of elements and components. Further, all or part of the functionality of illustrated elements may co-exist or be distributed among several geographically dispersed locations. Moreover, the disclosed examples may be implemented in various environments and are not limited to the illustrated examples. Thus, the present disclosure merely sets forth possible examples of implementations, and many variations and modifications may be made to the described examples. All such modifications and variations are intended to be included within the scope of this disclosure and protected by the following claims.

The invention claimed is:

1. A narrow-optical linewidth laser generation device comprising:
    a single-wavelength mirror formed from a plurality of optical ring resonators;
    a splitter coupled with the plurality of optical ring resonators, the splitter comprises an optical splitter to combine outputs of each of the plurality of optical ring resonators;
    a quantum dot optical amplifier (QDOA) coupled with the splitter;
    a phase-tuner coupled with the QDOA; and
    a broadband mirror coupled with the phase-tuner, wherein the phase-tuner is tuned to generate an output laser beam on a longer wavelength side of a peak of a transmission spectrum associated with the plurality of optical ring resonators and to provide a negative optical feedback to further narrow an optical linewidth of the output laser beam.

2. The narrow-optical linewidth laser generation device of claim 1, further comprising an input waveguide coupled with the plurality of optical ring resonators, and wherein the plurality of optical ring resonators are further coupled with respective coupling optical waveguides to couple outputs of the plurality of optical ring resonators to the splitter.

3. The narrow-optical linewidth laser generation device of claim 1, wherein the QDOA is formed on a passive silicon waveguide.

4. The narrow-optical linewidth laser generation device of claim 1, wherein the plurality of optical ring resonators comprises two optical ring resonators, each optical ring resonator having a slightly different free spectral range (FSR).

5. The narrow-optical linewidth laser generation device of claim 1, wherein the QDOA comprises a passive silicon waveguide coupled with a quantum dot (QD) stack of layers, wherein each of the passive silicone waveguide and the QD stack of layers is tapered at two spaced apart points along a length thereof.

6. The narrow-optical linewidth laser generation device of claim 5, wherein
at a first point of the two spaced apart points, the passive silicon waveguide is tapered from a first width to a second width that is narrower than the first width, and the QD stack of layers is tapered from a third width to a fourth width that is wider than the third width, and
at a second point of the two spaced apart points, the passive silicon waveguide is tapered from the second width to the first width, and the QD stack of layers is tapered from the fourth width to the third width.

7. The narrow-optical linewidth laser generation device of claim 1, wherein a Vernier free spectral range ($FSR_{Vernier}$) of the single wavelength mirror is greater than a gain spectrum of the QDOA, wherein the $FSR_{Vernier}$ is calculated based on a first FSR and a second FSR of respective first and second optical ring resonators of the plurality of optical ring resonators.

8. The narrow-optical linewidth laser generation device of claim 1, wherein the plurality of optical ring resonators of the single-wavelength mirror corresponds to the transmission spectrum.

9. A narrow-optical linewidth comb laser generation device comprising:
a multiwavelength mirror formed from an optical ring resonator;
a quantum dot optical amplifier (QDOA) coupled with the optical ring resonator, the QDOA comprising a passive silicon waveguide coupled with a quantum dot (QD) stack of layers, each of the passive silicone waveguide and the QD stack of layers is tapered at two spaced apart points along a length thereof, and the passive silicon waveguide and the QD stack of layers are each tapered in opposite directions at each spaced apart point;
a phase-tuner coupled with the QDOA; and a
broadband mirror coupled with the phase-tuner, wherein the phase-tuner is tuned to generate an output laser beam on a longer wavelength side of a peak of a transmission spectrum associated with the optical ring resonator and to provide a negative optical feedback to further narrow an optical linewidth of the output laser beam.

10. The narrow-optical linewidth comb laser generation device of claim 9, further comprising a splitter deployed between and coupled with the optical ring resonator and the QDOA.

11. The narrow-optical linewidth comb laser generation device of claim 9, wherein the broadband mirror comprises a distributed Bragg reflector (DBR).

12. The narrow-optical linewidth comb laser generation device of claim 9, wherein the optical ring resonator is coupled to both input waveguides of an optical splitter.

13. The narrow-optical linewidth comb laser generation device of claim 9, wherein the optical ring resonator is between 50 GHz and 80 GHz.

14. A method of generating a narrow-optical linewidth laser, the method comprising:
using one or more optical ring resonators to form an input mirror;
coupling the one or more optical ring resonators to a quantum dot optical amplifier (QDOA), wherein the QDOA comprising a passive silicon waveguide coupled with a quantum dot (QD) stack of layers, each of the passive silicone waveguide and the QD stack of layers is tapered at two spaced apart points along a length thereof, and the passive silicon waveguide and the QD stack of layers are each tapered in opposite directions at each spaced apart point;
coupling the QDOA to a phase-tuner;
generating a narrow optical linewidth laser by coupling the phase-tuner to a broadband mirror; and
tuning the phase-tuner to generate a narrow optical linewidth laser with a wavelength greater than a wavelength of a peak of a transmission spectrum associated with the one or more optical ring resonators and to provide a negative optical feedback which further narrows an optical linewidth of the narrow optical linewidth laser.

15. The method of claim 14, further comprising coupling the one or more optical ring resonators to a 50% splitter and coupling the 50% splitter to the QDOA.

16. The method of claim 14, wherein the one or more optical ring resonators have different radii corresponding with different free spectral range (FSR).

17. The method of claim 14, wherein the broadband mirror comprises a distributed Bragg reflector (DBR).

* * * * *